(12) United States Patent
Rhodes

(10) Patent No.: US 6,232,626 B1
(45) Date of Patent: May 15, 2001

(54) TRENCH PHOTOSENSOR FOR A CMOS IMAGER

(75) Inventor: Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/241,080

(22) Filed: Feb. 1, 1999

(51) Int. Cl.[7] .................. H01L 31/062; H01L 31/113; H01L 31/06; H01L 31/00

(52) U.S. Cl. ............... 257/292; 257/291; 257/448; 257/461; 257/465; 257/466

(58) Field of Search ..................... 257/290, 291, 257/292, 436, 448, 461, 462, 465, 466

(56) References Cited

U.S. PATENT DOCUMENTS

| | | |
|---|---|---|
| 4,374,700 | 2/1983 | Scott et al. . |
| 4,972,244 | * 11/1990 | Buffet et al. . |
| 5,055,900 | 10/1991 | Fossum et al. . |
| 5,173,756 | 12/1992 | Wong et al. . |
| 5,239,193 | * 8/1993 | Benton ................................. 257/292 |
| 5,319,604 | 6/1994 | Imondi et al. . |
| 5,461,425 | 10/1995 | Fowler et al. . |
| 5,471,515 | 11/1995 | Fossum et al. . |
| 5,541,402 | 7/1996 | Ackland et al. . |
| 5,576,763 | 11/1996 | Ackland et al. . |
| 5,612,799 | 3/1997 | Yamazaki et al. . |
| 5,614,744 | 3/1997 | Merrill . |
| 5,625,210 | 4/1997 | Lee et al. . |
| 5,705,846 | 1/1998 | Merrill . |
| 5,708,263 | 1/1998 | Wong . |
| 5,721,425 | 2/1998 | Merrill . |
| 5,731,622 | 3/1998 | Sugiyama et al. . |
| 5,757,045 | 5/1998 | Tsai et al. . |
| 6,118,142 | * 9/2000 | Chen et al. .......................... 257/232 |

OTHER PUBLICATIONS

Dickinson, A., et al., *A 256×256 CMOS Active Pixel Image Sensor with Motion Detection*, 1995 IEEE International Solid–State Circuits Conference, pp. 226–227.

Dickinson, A., et al., *Standard CMOS Active Pixel Image Sensors for Multimedia Applications*, Proceedings of Sixteenth Conference on Advanced Research in VLSI, Mar. 27–29, 1995, pp. 214–224.

Eid, E–S., et al., *A 256×256 CMOS Active Pixel Image Sensor*, Proc. SPIE vol. 2415, Apr. 1995, pp. 265–275.

Fossum, E., *CMOS Image Sensors: Electronic Camera On A Chip*, 1995 IEEE, pp. 17–25.

(List continued on next page.)

Primary Examiner—Ngân V. Ngô
(74) Attorney, Agent, or Firm—Dickstein Shapiro Morin & Oshinsky, LLP

(57) ABSTRACT

A trench photosensor for use in a CMOS imager having an improved charge capacity. The trench photosensor may be either a photogate or photodiode structure. The trench shape of the photosensor provides the photosensitive element with an increased surface area compared to a flat photosensor occupying a comparable area on a substrate. The trench photosensor also exhibits a higher charge capacity, improved dynamic range, and a better signal-to-noise ratio. Also disclosed are processes for forming the trench photosensor.

84 Claims, 9 Drawing Sheets

OTHER PUBLICATIONS

Fossum, E., et al., *IEDM A 37×28mm² 600k–Pixel CMOS APS Dental X–Ray Camera–on–a–Chip with Self–Triggered Readout*, 1998 IEEE International Solid–State Circuits Conference, pp. 172–173.

Fossum, E., *Low Power Camera–on–a–Chip Using CMOS Active Pixel Sensor Technology*, 1995 IEEE, pp. 74–77.

Fossum, E., *Architectures for focal plane image processing*, Optical Engineering, vol. 28, No. 8, Aug. 1989, pp. 865–871.

Janesick, J. et al., *New advancements in charge–coupled device technology—sub–electron noise and 4096×4096 pixel CCDs*, Proc. SPIE vol. 1242, 1990, pp. 223–237.

Kemeny, S.E., et al., *Update on focal–plane image processing research*, Proc. SPIE vol. 1447, 1991, pp. 243–250.

Mendis S., et al., *CMOS Active Pixel Image Sensor*, IEEE Transactions on Electron Devices, vol. 41, No. 3, Mar. 1994, pp. 452–453.

Mendis, S.K., et al., *A 128×128 CMOS Active Pixel Image Sensor for Highly Integrated Imaging Systems*, 1993 IEEE, pp. 583–586.

Mendis, S.K., et al., *CMOS Active Pixel Image Sensors for Highly Integrated Imaging Systems*, IEEE Journal of Solid–State Circuits, vol. 32, No. 2, Feb. 1997, pp. 187–197.

Mendis, S.K., et al., *Design of a Low–Light–Level Image Sensor with On–Chip Sigma–Delta Analog–to–Digital Conversion*, Proc. SPIE vol. 1900, Jul. 1993, pp. 31–39.

Mendis, S.K., et al., *Low–Light–Level Image Sensor with On–Chip Signal Processing*, Proc. SPIE vol. 1952, Nov. 1993, pp. 23–33.

Mendis, S.K., et al., *Progress In CMOS Active Pixel Image Sensors*, Proc. SPIE vol. 2172, May 1994, pp. 19–29.

Nakamura, J., et al., *CMOS Active Pixel Image Sensor with Simple Floating Gate Pixels*, IEEE Transactions on Electron Devices, vol. 42, No. 9, Sep. 1995, pp. 1693–1694.

Nixon, R.H., et al., *256×256 CMOS Active Pixel Sensor Camera–on–a–Chip*, IEEE Journal of Solid–State Circuits, vol. 31, No. 12, Dec. 1996, pp. 2046–2050.

Nixon, R.H., et al. *256×256 CMOS Active Pixel Sensor Camera–on–a–Chip*, 1996 IEEE International Solid–State Circuits Conference, pp. 178–179.

Panicacci, R., et al., *Programmable multiresolution CMOS active pixel sensor*, Proc. SPIE vol. 27654, Mar. 1996, pp. 72–79.

Panicacci, R.A., et al., *128Mb/s Multiport CMOS Binary Active–Pixel Image Sensor*, 1996 IEEE International Solid–State Circuit Conference, pp. 100–101.

Yadid–Pecht, o., et al., *CMOS Active Pixel Sensor Star Tracker with Regional Electronic Shutter*, IEEE Journal of Solid–State Circuits, vol. 32, No. 2, Feb. 1997, pp. 285–288.

Yadid–Pecht, O., et al., *Wide dynamic range APS star tracker*, Proc. SPIE vol. 2654, Mar. 1996, pp. 82–92.

Zarnowski, J., et al., *Imaging options expand with CMOS technology*, Laser Focus World, Jun. 1997, pp. 125–130.

Zhou, Z., et al., *A Cmos Imager with On–Chip Variable Resolution for Light–Adaptive Imaging*, 1998 IEEE International Solid–State Circuits Conference, pp. 174–174.

Zhou, Z., et al., *A Digital CMOS Active Pixel Image Sensor For Multimedia Applications*, Proc. SPIE Vol. 2894, Sep. 1996, pp. 282–288.

* cited by examiner

TRENCH PHOTOSENSOR FOR A CMOS IMAGER

FIELD OF THE INVENTION

The present invention relates generally to improved semiconductor imaging devices and in particular to a silicon imaging device that can be fabricated using a standard CMOS process.

BACKGROUND OF THE INVENTION

There are a number of different types of semiconductor-based imagers, including charge coupled devices (CCDs), photodiode arrays, charge injection devices and hybrid focal plane arrays. CCD technology is often employed for image acquisition and enjoys a number of advantages which makes it the incumbent technology, particularly for small size imaging applications. CCDs are capable of large formats with small pixel size and they employ low noise charge domain processing techniques. However, CCD imagers also suffer from a number of disadvantages. For example, they are susceptible to radiation damage, they exhibit destructive read-out over time, they require good light shielding to avoid image smear and they have a high power dissipation for large arrays. Additionally, while offering high performance, CCD arrays are difficult to integrate with CMOS processing in part due to a different processing technology and to their high capacitances, complicating the integration of on-chip drive and signal processing electronics with the CCD array. While there have been some attempts to integrate on-chip signal processing with CCD arrays, these attempts have not been entirely successful. CCDs also must transfer an image by line charge transfers from pixel to pixel, requiring that the entire array be read out into a memory before individual pixels or groups of pixels can be accessed and processed. This takes time. CCDs may also suffer from incomplete charge transfer from pixel to pixel which results in image smear.

Because of the inherent limitations in CCD technology, there is an interest in CMOS imagers for possible use as low cost imaging devices. A filly compatible CMOS sensor technology enabling a higher level of integration of an image array with associated processing circuits would be beneficial to many digital applications such as, for example, in cameras, scanners, machine vision systems, vehicle navigation systems, video telephones, computer input devices, surveillance systems, auto focus systems, star trackers, motion detection systems, image stabilization systems and data compression systems for high-definition television.

The advantages of CMOS imagers over CCD imagers are that CMOS imagers have a low voltage operation and low power consumption; CMOS imagers are compatible with integrated on-chip electronics (control logic and timing, image processing, and signal conditioning such as A/D conversion); CMOS imagers allow random access to the image data; and CMOS imagers have lower fabrication costs as compared with the conventional CCD because standard CMOS processing techniques can be used. Additionally, low power consumption is achieved for CMOS imagers because only one row of pixels at a time needs to be active during the readout and there is no charge transfer (and associated switching) from pixel to pixel during image acquisition. On-chip integration of electronics is particularly advantageous because of the potential to perform many signal conditioning functions in the digital domain (versus analog signal processing) as well as to achieve a reduction in system size and cost.

A CMOS imager circuit includes a focal plane array of pixel cells, each one of the cells including either a photogate, photoconductor or a photodiode overlying a substrate for accumulating photo-generated charge in the underlying portion of the substrate. A readout circuit is connected to each pixel cell and includes at least an output field effect transistor formed in the substrate and a charge transfer section formed on the substrate adjacent the photogate, photoconductor or photodiode having a sensing node, typically a floating diffusion node, connected to the gate of an output transistor. The imager may include at least one electronic device such as a transistor for transferring charge from the underlying portion of the substrate to the floating diffusion node and one device, also typically a transistor, for resetting the node to a predetermined charge level prior to charge transference.

In a CMOS imager, the active elements of a pixel cell perform the necessary functions of: (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of a signal representing pixel charge. Photo charge may be amplified when it moves from the initial charge accumulation region to the floating diffusion node. The charge at the floating diffusion node is typically converted to a pixel output voltage by a source follower output transistor. The photosensitive element of a CMOS imager pixel is typically either a depleted p-n junction photodiode or a field induced depletion region beneath a photogate. For photodiodes, image lag can be eliminated by completely depleting the photodiode upon readout.

CMOS imagers of the type discussed above are generally known as discussed, for example, in Nixon et al., "256×256 CMOS Active Pixel Sensor Camera-on-a-Chip," IEEE Journal of Solid-State Circuits, Vol. 31(12), pp. 2046–2050 (1996); Mendis et al., "CMOS Active Pixel Image Sensors," IEEE Transactions on Electron Devices, Vol. 41(3), pp. 452–453 (1994), as well as U.S. Pat. No. 5,708,263 and U.S. Pat. No. 5,471,515, which are herein incorporated by reference.

To provide context for the invention, an exemplary CMOS imaging circuit is described below with reference to FIG. 1. The circuit described below, for example, includes a photogate for accumulating photo-generated charge in an underlying portion of the substrate. It should be understood that the CMOS imager may include a photodiode or other image to charge converting device, in lieu of a photogate, as the initial accumulator for photo-generated charge.

Reference is now made to FIG. 1 which shows a simplified circuit for a pixel of an exemplary CMOS imager using a photogate and having a pixel photodetector circuit 14 and a readout circuit 60. It should be understood that while FIG. 1 shows the circuitry for operation of a single pixel, that in practical use there will be an M×N array of pixels arranged in rows and columns with the pixels of the array accessed using row and column select circuitry, as described in more detail below.

The photodetector circuit 14 is shown in part as a cross-sectional view of a semiconductor substrate 16 typically a p-type silicon, having a surface well of p-type material 20. An optional layer 18 of p-type material may be used if desired, but is not required. Substrate 16 may be formed of, for example, Si, SiGe, Ge, or GaAs. Typically the entire substrate 16 is p-type doped silicon substrate and may contain a surface p-well 20 (with layer 18 omitted), but many other options are possible, such as, for example p on p– substrates, p on p+ substrates, p-wells in n-type substrates or the like. The terms wafer or substrate used in the description includes any semiconductor-based structure having an exposed surface in which to form the circuit structure used in the invention. Wafer and substrate are to be understood as including silicon-on-insulator (SOI) technology, silicon-on-sapphire (SOS) technology, doped and undoped semiconductors, epitaxial layers of silicon supported by a base semiconductor foundation, and other semiconductor structures. Furthermore, when reference is made to a wafer or substrate in the following description, previous process steps may have been utilized to form regions/junctions in the base semiconductor structure or foundation.

An insulating layer 22 such as, for example, silicon dioxide is formed on the upper surface of p-well 20. The p-type layer may be a p-well formed in substrate 16. A photogate 24 thin enough to pass radiant energy or of a material which passes radiant energy is formed on the insulating layer 22. The photogate 24 receives an applied control signal PG which causes the initial accumulation of pixel charges in n+ region 26. The n+ type region 26, adjacent one side of photogate 24, is formed in the upper surface of p-well 20. A transfer gate 28 is formed on insulating layer 22 between n+ type region 26 and a second n+ type region 30 formed in p-well 20. The n+ regions 26 and 30 and transfer gate 28 form a charge transfer transistor 29 which is controlled by a transfer signal TX. The n+ region 30 is typically called a floating diffusion region. It is also a node for passing charge accumulated thereat to the gate of a source follower transistor 36 described below. A reset gate 32 is also formed on insulating layer 22 adjacent and between n+ type region 30 and another n+ region 34 which is also formed in p-well 20. The reset gate 32 and n+ regions 30 and 34 form a reset transistor 31 which is controlled by a reset signal RST. The n+ type region 34 is coupled to voltage source $V_{DD}$, e.g., 5 volts. The transfer and reset transistors 29, 31 are n-channel transistors as described in this implementation of a CMOS imager circuit in a p-well. It should be understood that it is possible to implement a CMOS imager in an n-well in which case each of the transistors would be p-channel transistors. It should also be noted that while FIG. 1 shows the use of a transfer gate 28 and associated transistor 29, this structure provides advantages, but is not required.

Photodetector circuit 14 also includes two additional n-channel transistors, source follower transistor 36 and row select transistor 38. Transistors 36, 38 are coupled in series, source to drain, with the source of transistor 36 also coupled over lead 40 to voltage source $V_{DD}$ and the drain of transistor 38 coupled to a lead 42. The drain of row select transistor 38 is connected via conductor 42 to the drains of similar row select transistors for other pixels in a given pixel row. A load transistor 39 is also coupled between the drain of transistor 38 and a voltage source $V_{SS}$, e.g. 0 volts. Transistor 39 is kept on by a signal $V_{LN}$ applied to its gate.

The imager includes a readout circuit 60 which includes a signal sample and hold (S/H) circuit including a S/H n-channel field effect transistor 62 and a signal storage capacitor 64 connected to the source follower transistor 36 through row transistor 38. The other side of the capacitor 64 is connected to a source voltage $V_{SS}$. The upper side of the capacitor 64 is also connected to the gate of a p-channel output transistor 66. The drain of the output transistor 66 is connected through a column select transistor 68 to a signal sample output node $V_{OUTS}$ and through a load transistor 70 to the voltage supply $V_{DD}$. A signal called "signal sample and hold" (SHS) briefly turns on the S/H transistor 62 after the charge accumulated beneath the photogate electrode 24 has been transferred to the floating diffusion node 30 and from there to the source follower transistor 36 and through row select transistor 38 to line 42, so that the capacitor 64 stores a voltage representing the amount of charge previously accumulated beneath the photogate electrode 24.

The readout circuit 60 also includes a reset sample and hold (S/H) circuit including a S/H transistor 72 and a signal storage capacitor 74 connected through the S/H transistor 72 and through the row select transistor 38 to the source of the source follower transistor 36. The other side of the capacitor 74 is connected to the source voltage $V_{SS}$. The upper side of the capacitor 74 is also connected to the gate of a p-channel output transistor 76. The drain of the output transistor 76 is connected through a p-channel column select transistor 78 to a reset sample output node $V_{OUTR}$ and through a load transistor 80 to the supply voltage $V_{DD}$. A signal called "reset sample and hold" (SHR) briefly turns on the S/H transistor 72 immediately after the reset signal RST has caused reset transistor 31 to turn on and reset the potential of the floating diffusion node 30, so that the capacitor 74 stores the voltage to which the floating diffusion node 30 has been reset.

The readout circuit 60 provides correlated sampling of the potential of the floating diffusion node 30, first of the reset charge applied to node 30 by reset transistor 31 and then of the stored charge from the photogate 24. The two samplings of the diffusion node 30 charges produce respective output voltages $V_{OUTR}$ and $V_{OUTS}$ of the readout circuit 60. These voltages are then subtracted ($V_{OUTS}$-$V_{OUTR}$) by subtractor 82 to provide an output signal terminal 81 which is an image signal independent of pixel to pixel variations caused by fabrication variations in the reset voltage transistor 31 which might cause pixel to pixel variations in the output signal.

FIG. 2 illustrates a block diagram for a CMOS imager having a pixel array 200 with each pixel cell being constructed in the manner shown by element 14 of FIG. 1. FIG. 4 shows a 2×2 portion of pixel array 200. Pixel array 200 comprises a plurality of pixels arranged in a predetermined number of columns and rows. The pixels of each row in array 200 are all turned on at the same time by a row select line, e.g., line 86, and the pixels of each column are selectively output by a column select line, e.g., line 42. A plurality of rows and column lines are provided for the entire array 200. The row lines are selectively activated by the row driver 210 in response to row address decoder 220 and the column select lines are selectively activated by the column driver 260 in response to column address decoder 270. Thus, a row and column address is provided for each pixel. The CMOS imager is operated by the control circuit 250 which controls address decoders 220,270 for selecting the appropriate row and column lines for pixel readout, and row and column driver circuitry 210,260 which apply driving voltage to the drive transistors of the selected row and column lines.

FIG. 3 shows a simplified timing diagram for the signals used to transfer charge out of photodetector circuit 14 of the FIG. 1 CMOS imager. The photogate signal PG is nominally set to 5V and pulsed from 5V to 0V during integration. The reset signal RST is nominally set at 2.5V. As can be seen from the figure, the process is begun at time to by briefly pulsing reset voltage RST to 5V. The RST voltage, which is applied to the gate 32 of reset transistor 31, causes transistor 31 to turn on and the floating diffusion node 30 to charge to the $V_{DD}$ voltage present at n+ region 34 (less the voltage drop $V_{TH}$ of transistor 31). This resets the floating diffusion node 30 to a predetermined voltage ($V_{DD}$-$V_{TH}$). The charge on floating diffusion node 30 is applied to the gate of the source follower transistor 36 to control the current passing through transistor 38, which has been turned on by a row select (ROW) signal, and load transistor 39. This current is translated into a voltage on line 42 which is next sampled by providing a SHR signal to the S/H transistor 72 which charges capacitor 74 with the source follower transistor output voltage on line 42 representing the reset charge present at floating diffusion node 30. The PG signal is next pulsed to 0 volts, causing charge to be collected in n+ region 26. A transfer gate voltage TX, similar to the reset pulse RST, is then applied to transfer gate 28 of transistor 29 to cause the charge in n+ region 26 to transfer to floating diffusion node 30. It should be understood that for the case of a photogate, the transfer gate voltage TX may be pulsed or held to a fixed DC potential. For the implementation of a photodiode with a transfer gate, the transfer gate voltage TX must be pulsed. The new output voltage on line 42 generated by source follower transistor 36 current is then sampled onto capacitor 64 by enabling the sample and hold switch 62 by signal SHS. The column select signal is next applied to transistors 68 and 70 and the respective charges stored in capacitors 64 and 74 are subtracted in subtractor 82 to provide a pixel output signal at terminal 81. It should also be noted that CMOS imagers may dispense with the transfer gate 28 and associated transistor 29, or retain these structures while biasing the transfer transistor 29 to an always "on" state.

The operation of the charge collection of the CMOS imager is known in the art and is described in several publications such as Mendis et al., "Progress in CMOS Active Pixel Image Sensors," SPIE Vol. 2172, pp. 19–29 (1994); Mendis et al., "CMOS Active Pixel Image Sensors for Highly Integrated Imaging Systems," IEEE Journal of Solid State Circuits, Vol. 32(2) (1997); and Eric R Fossum, "CMOS Image Sensors: Electronic Camera on a Chip," IEDM Vol. 95, pp. 17–25 (1995) as well as other publications. These references are incorporated herein by reference.

Prior CMOS pixel photosensors suffer dynamic range and charge capacity limitations, and undesirably low signal-to-noise ratios. Attempts to increase charge capacity and improve signal-to-noise ratios have typically focused on using photogate photosensors instead of photodiodes, adding transfer gate stacks to enhance charge transfer, and increasing the size of the photosensor. These methods add process complexity, may limit the use of advantageous features such as silicided gates, and may result in increased pixel cell sizes, thereby reducing pixel array densities.

There is needed, therefore, an improved pixel photosensor for use in an imager that exhibits improved dynamic range, a better signal-to-noise ratio, and improved charge capacity for longer integration times. A method of fabricating a pixel photosensor exhibiting these improvements is also needed.

SUMMARY OF THE INVENTION

The present invention provides a trench photosensor formed in a doped semiconductor substrate for use in a pixel sensor cell. The trench photosensor comprises a doped region on the sides and bottom of a trench, with a conductive layer formed over the doped region. For a photogate-type photosensor, a dielectric layer is preferably formed on the trench sides and bottom prior to forming the conductive layer. Also provided are methods for forming the trench photosensor of the present invention.

Additional advantages and features of the present invention will be apparent from the following detailed description and drawings which illustrate preferred embodiments of the invention.

DETAILED DESCRIPTION OF PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The term "pixel" refers to a picture element unit cell containing a photosensor and transistors for converting electromagnetic radiation to an electrical signal. For purposes of illustration, a representative pixel is illustrated in the figures and description herein, and typically fabrication of all pixels in an imager will proceed simultaneously in a similar fashion. The following detailed description is, therefore, not to be taken in a limiting sense, and the scope of the present invention is defined by the appended claims.

Figure 5:
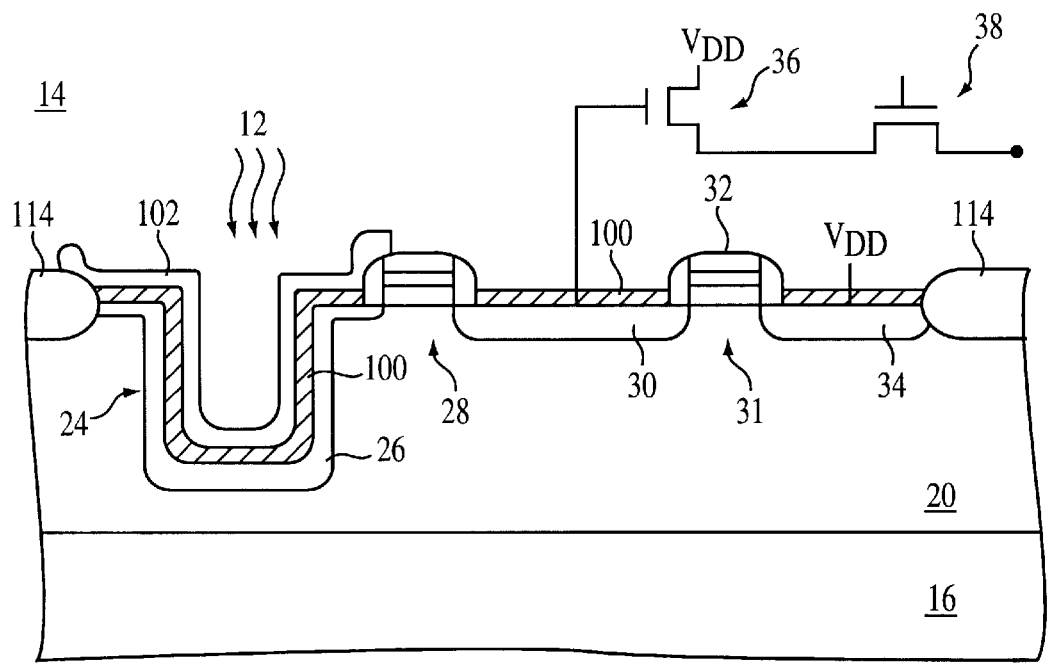
FIG. 5 is a cross-sectional view of a pixel sensor cell according to one embodiment of the present invention.

The structure of the pixel cell 14 of the first embodiment is shown in more detail in FIG. 5. The pixel cell 14 may be formed in a substrate 16 having a doped layer or well 20 of a first conductivity type, which for exemplary purposes is treated as a p-type substrate. The doped layer 20 is provided with three doped regions 26, 30, and 34, which are doped to a second conductivity type, which for exemplary purposes is treated as n-type. The first doped region 26 is the photosite, and it underlies a conductive layer 102 of material transparent to radiant energy, such as polysilicon. The photosite 26 and the conductive layer 102 together form a photosensor 24. An insulating layer 100 of silicon dioxide, silicon nitride, ON (oxide-nitride), NO (nitride-oxide), ONO (oxide-nitride-oxide) or other suitable material is formed between the conductive layer 102 and the photosite 26. If a deposited insulating layer 100 is used (as opposed to a grown layer), it may extend over a pixel-isolating field oxide region 114 on the opposite side of the photosensor 24 from the transfer gate 28. The second doped region 30 is the floating diffusion region, sometimes also referred to as a floating diffusion node, and it serves as the source for the reset transistor 31. The third doped region 34 is the drain of the reset transistor 31, and is also connected to voltage source $V_{DD}$.

Figure 6:
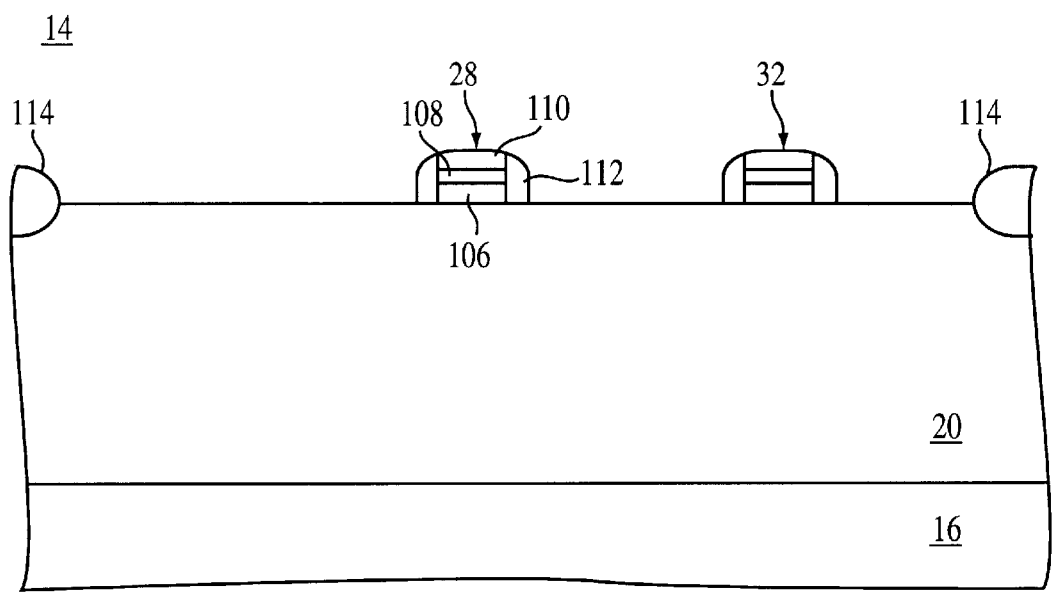
FIG. 6 is a cross-sectional view of a semiconductor wafer undergoing the process of a preferred embodiment of the invention.

The trench photosensor 24 is manufactured through a process described as follows, and illustrated by FIGS. 6 through 11. Referring now to FIG. 6, a substrate 16, which may be any of the types of substrates described above, is doped to form a doped substrate layer or well 20 of a first conductivity type, which for exemplary purposes will be described as p-type. A field oxide layer 114 is formed around the cell 14 at this time, and is shown in FIG. 5 as residing on a side of the photosite 26 opposite the transfer gate 28 and adjacent to the third doped region 34. The field oxide layer 114 may be formed by any known technique such as thermal oxidation of the underlying silicon in a LOCOS process or by etching trenches and filling them with oxide in an STI process.

Next, the reset transistor gate stack 32 and an optional transfer gate stack 28 are formed. These include a silicon dioxide or silicon nitride insulator 106 on the doped layer 20, and a conductive layer 108 of doped polysilicon, tungsten, or other suitable material over the insulating layer 106. An insulating cap layer 110 of, for example, silicon dioxide, silicon nitride, ON, NO, or ONO may be formed if desired; also a more conductive layer such as a silicide layer (not shown) may be used between the conductive layer 108 and the cap 110. Insulating sidewalls 112 are also formed on the sides of the gate stacks 28, 32. These sidewalls 112 may be formed of, for example, silicon dioxide, silicon nitride, ON, NO or ONO.

Figure 7:
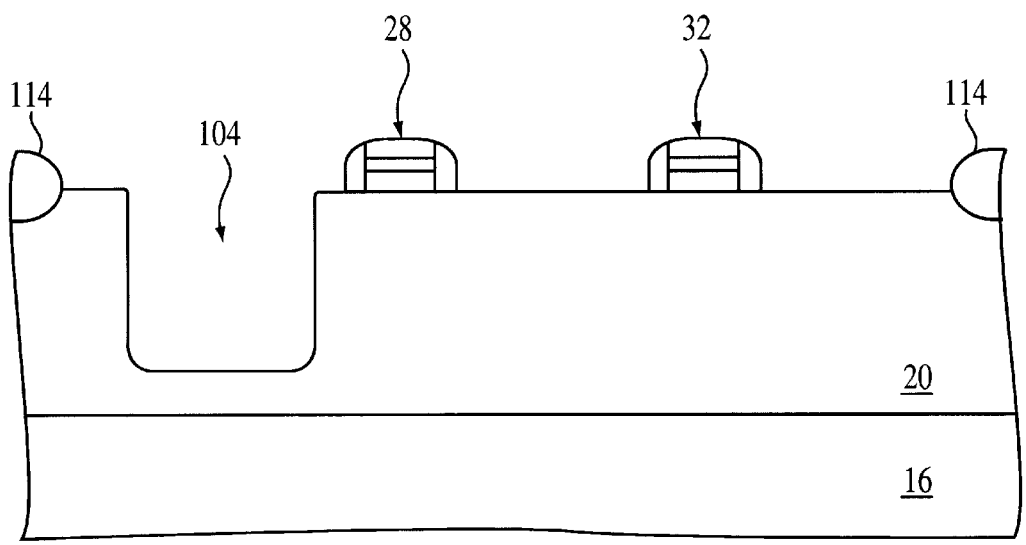
FIG. 7 shows the wafer of FIG. 6 at a processing step subsequent to that shown in FIG. 6.

As shown in FIG. 7, the next step is to form a trench in the doped layer 20. A resist and mask (not shown) are applied, and photolithographic techniques are used to define the area to be etched-out. A directional etching process such as Reactive Ion Etching (RIE), or etching with a preferential anisotropic etchant is used to etch into the doped layer 20 to a sufficient depth, e.g., about 0.05 to 10 $\mu$m, to form a trench 104. The deeper the trench 104, the higher the charge storage capacitance of the imager. The resist and mask are removed, leaving a structure that appears as shown in FIG. 7.

While the gate stacks may be formed after the trench is etched, for exemplary purposes and for convenience etching of the trench is described as occurring subsequent to gate stack formation. The order of these preliminary process steps may be varied as is required or convenient for a particular process flow, for example, if a photogate sensor which overlaps the transfer gate is desired, the gate stacks must be formed before the photogate, but if a nonoverlapping photogate is desired, the gate stacks are preferably formed after photogate formation. Similarly, fabrication of a photodiode photosensor is greatly simplified if the gate stacks are fabricated before the trench is etched.

In the next step of the process, doped regions are formed in the doped substrate layer 20 by any suitable doping process, such as ion implantation. A resist and mask (not shown) are used to shield areas of the layer 20 that are not to be doped. Three doped regions are formed in this step: the photosite 26, which is formed in the sides and bottom of the trench 104; the floating diffusion region 30; and a drain region 34.

Figure 8:
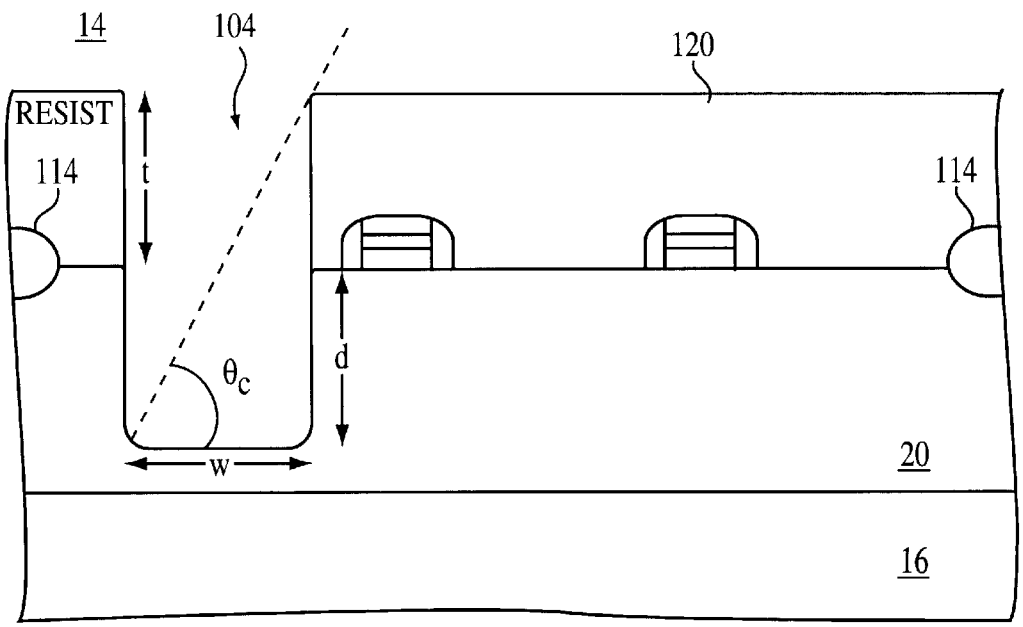
FIG. 8 shows the wafer of FIG. 6 at a processing step subsequent to that shown in FIG. 7.

The ion implantation of doped region 26 is preferably performed as a series of angled implants, typically four, to assure a more uniformly doped trench sidewall. FIG. 8 illustrates a resist layer 120 which covers all of the surface of the substrate layer 20 except the trench 104 to be doped. The implants are performed at implantation angles $\theta_I$ that are greater than the critical angle $\theta_C$, where each implant is orthogonal to the last implant performed. The value of $\theta_C$ is calculated according to the equation $\tan \theta_C = [(t+d)/(w)]$, where t is the thickness of the resist 120, d is the depth of the trench 104, and w is the width of the trench 104. The dose of each implant is between $1\times10^{12}$ ions/cm$^2$ and $1\times10^{16}$ ions/cm$^2$, preferably between $1\times10^{13}$ ions/cm$^2$ and $1\times10^{15}$ ions/cm$^2$, and most preferably about $5\times10^{13}$ ions/cm$^2$.

Figure 9:
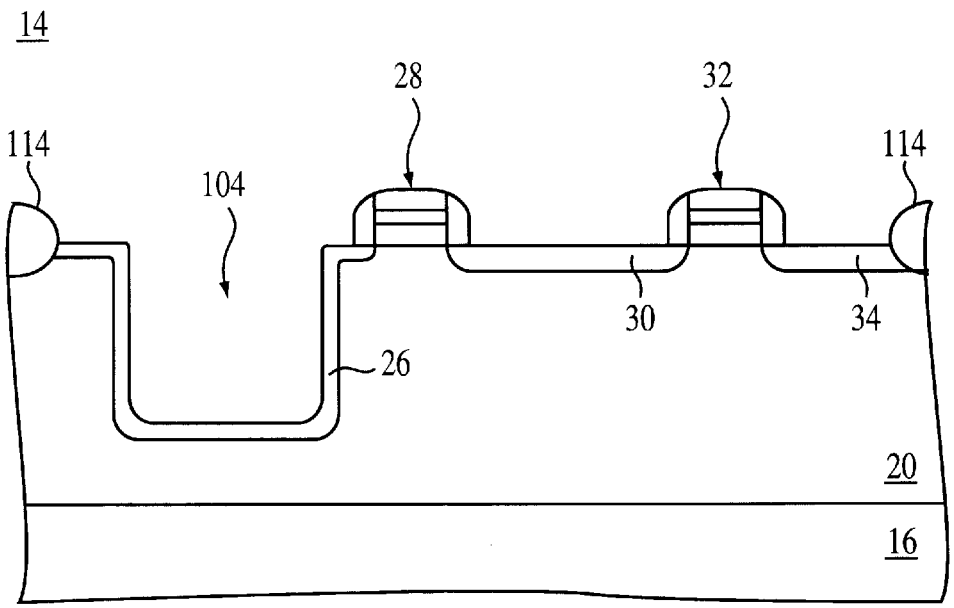
FIG. 9 shows the wafer of FIG. 6 at a processing step subsequent to that shown in FIG. 8.

After formation of the first doped region 26, the resist 120 and mask are stripped, and a second resist and mask (not shown) are applied. Standard ion implantation is then performed to dope the second and third doped regions 30, 34. As shown in FIG. 9, the doped regions 26, 30, 34 are doped to a second conductivity type, which for exemplary purposes will be considered to be n-type. The doping level of the doped regions 26, 30, 34 may vary but should be of comparable or greater strength than the doping level of the doped layer 20. Doped region 26 may be variably doped, such as either n+ or n− for an n-channel device. Doped region 34 should be strongly doped, i.e., for an n-channel device, the doped region 34 will be doped as n+. Doped region 30 is typically strongly doped (n+), and would not be lightly doped (n−) unless a buried contact is also used. If desired, multiple masks and resists may be used to dope regions 30, 34 to different levels.

Figure 10:
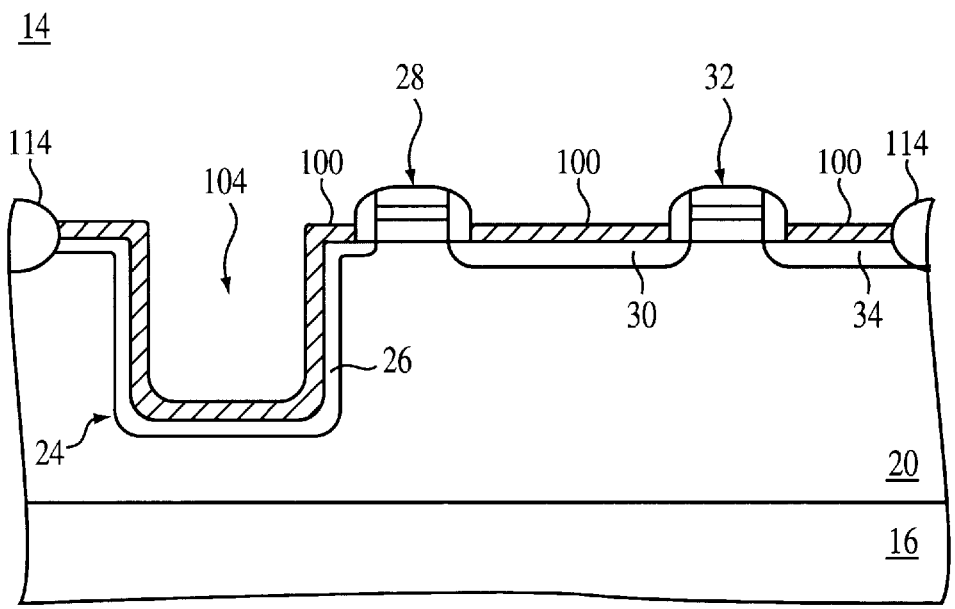
FIG. 10 shows the wafer of FIG. 6 at a processing step subsequent to that shown in FIG. 9.

Referring now to FIG. 10, an insulating layer 100 may now be formed on the sides and bottom of the trench 104 by chemical vapor deposition, thermal oxidation or other suitable means. The insulating layer 100 may be of silicon dioxide, silicon nitride, NO, ON, ONO, or other suitable material, and it has a thickness of approximately 20 to 500 Angstroms for a photogate photosensor. If a photodiode is formed instead of a photogate, the insulating layer 100 would typically be at least 30 Angstroms thick, and may, with the addition of further insulating and passivating layers on the device, be approximately 5 microns thick.

Figure 11:
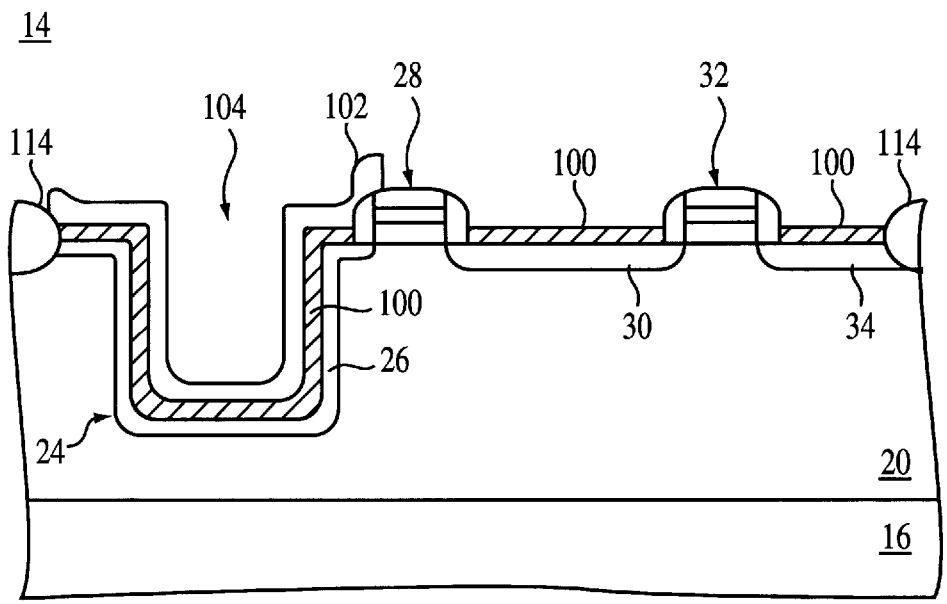
FIG. 11 shows the wafer of FIG. 6 at a processing step subsequent to that shown in FIG. 10.

As shown in FIG. 11, the final step in the process of the present invention is to form the photogate 24. The photogate 24 has a thin conductive layer 102 that is at least partially transparent to electromagnetic radiation of the wavelengths desired to be sensed. The conductive layer 102 is of a first conductivity type, and may be doped polysilicon, indium tin oxide, tin oxide, or other suitable material. The thickness of the conductive layer 102 may be any suitable thickness, e.g., approximately 200 to 4000 Angstroms. If the conductive material is a silicon material, then the conductive layer 102 will be formed by CVD or other suitable means, and if the conductive material is a metal compound, CVD, evaporation or sputtering are preferred means of forming the conductive layer 102. The conductive layer 102 is formed to cover substantial portions of the insulating layer 100, and may extend at least partially over the field oxide layer 114 and a portion of the transfer gate 28. The photosensor 24 at this stage is shown in FIG. 11.

Figure 1:
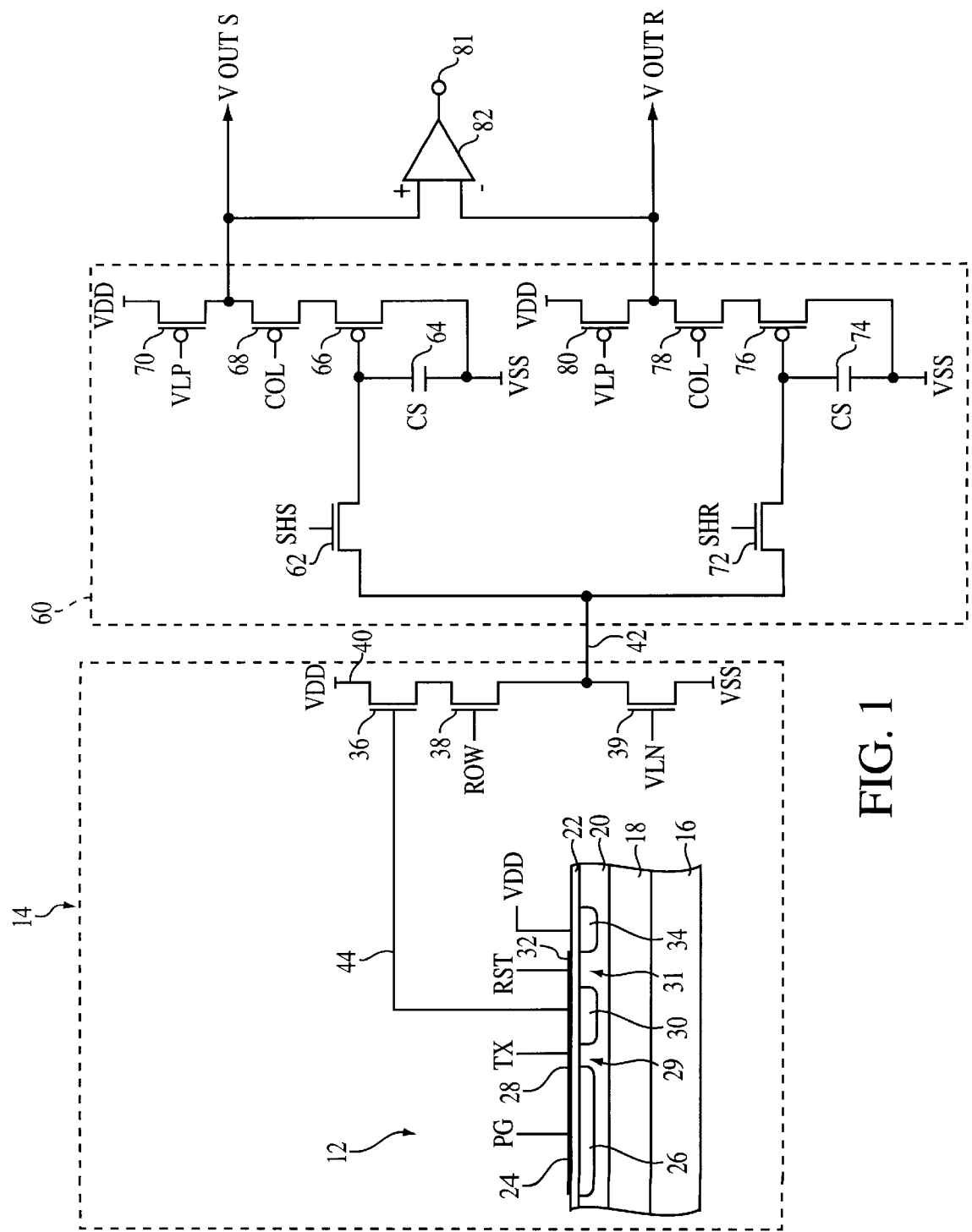
FIG. 1 is a representative circuit of a CMOS imager.
Figure 2:
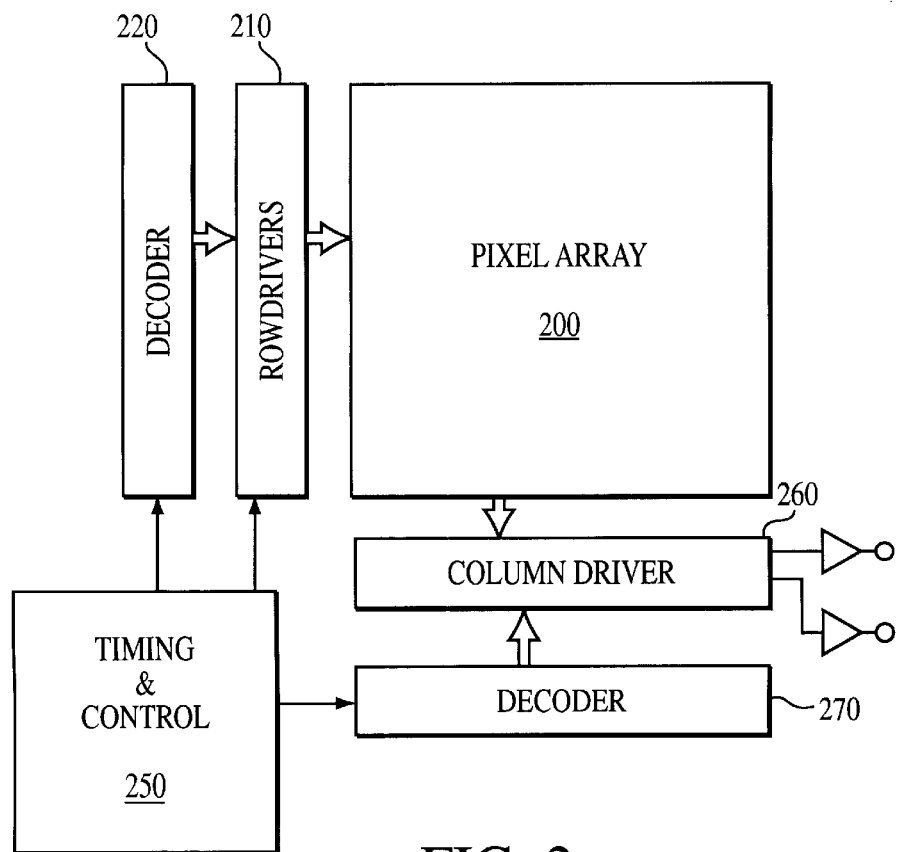
FIG. 2 is a block diagram of a CMOS pixel sensor chip.
Figure 3:
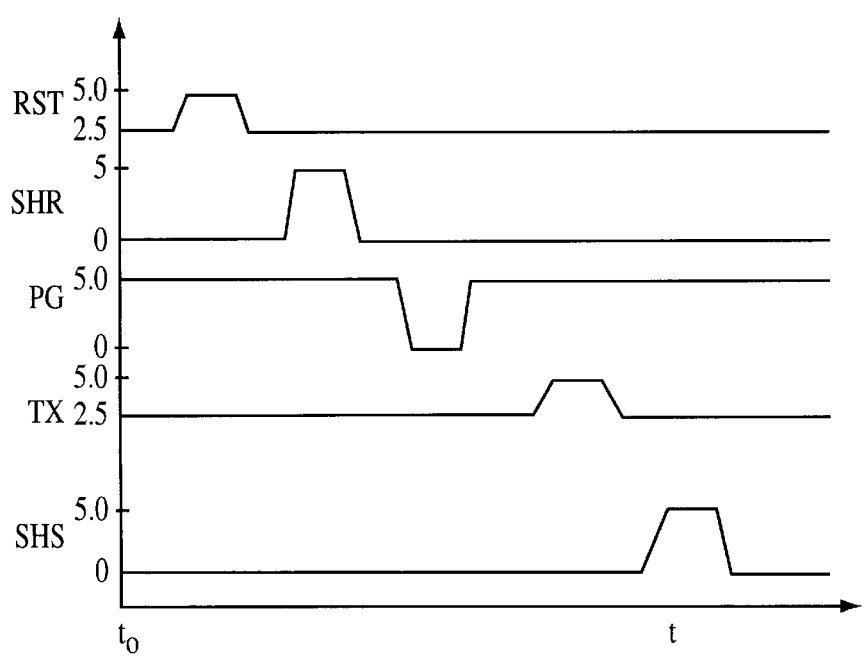
FIG. 3 is a representative timing diagram for the CMOS imager.
Figure 4:
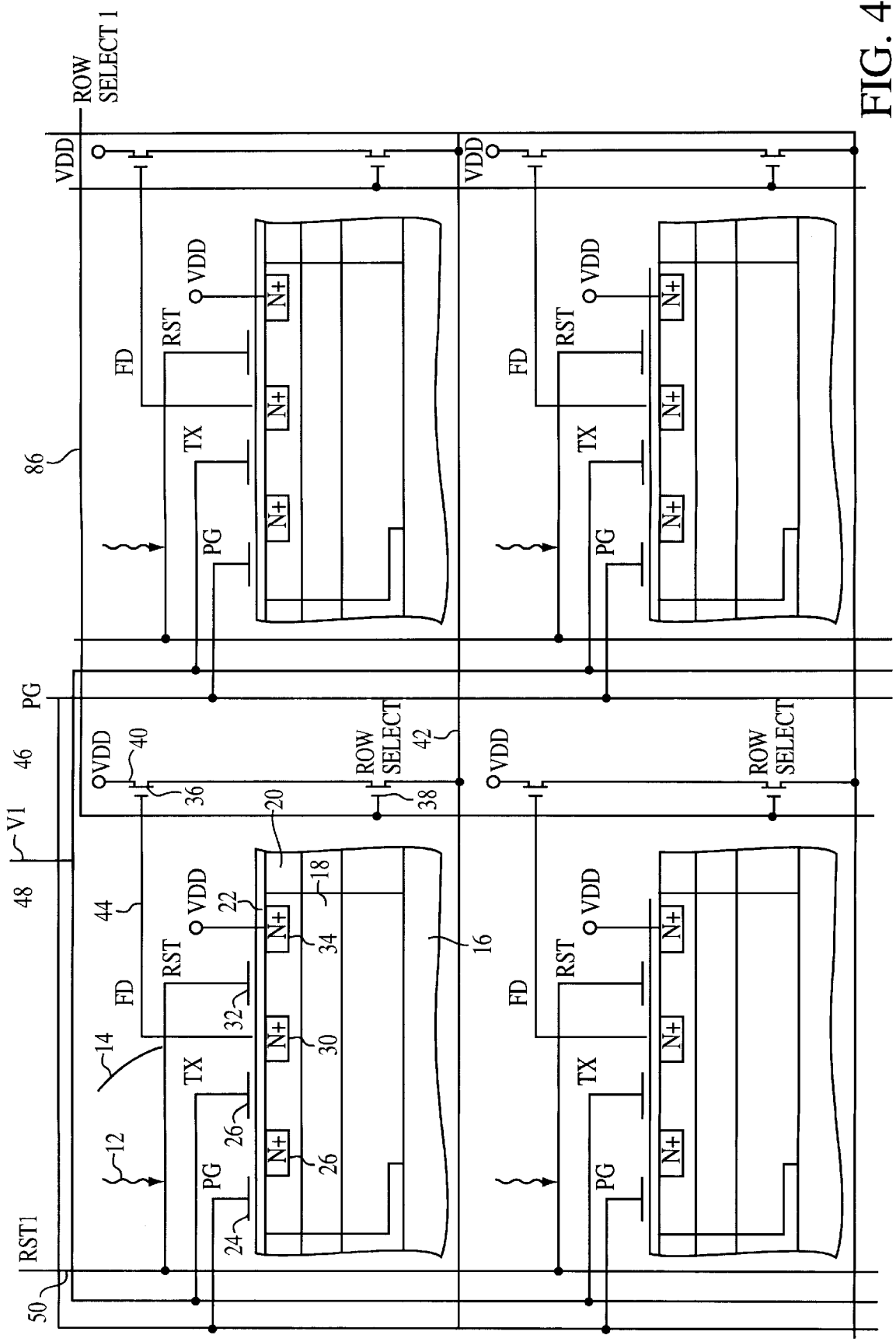
FIG. 4 is a representative pixel layout showing a 2×2 pixel layout.

For the pixel cell 14 of the first embodiment, the photosensor 24 is essentially complete at this stage, and conventional processing methods may then be used to form contacts and wiring to connect gate lines and other connections in the pixel cell 14. For example, the entire surface may then be covered with a passivation layer of, e.g., silicon dioxide, BSG, PSG, or BPSG, which is CMP planarized and etched to provide contact holes, which are then metallized to provide contacts to the photogate, reset gate, and transfer gate. Conventional multiple layers of conductors and insulators may also be used to interconnect the structures in the manner shown in FIG. 1.

Figure 12:
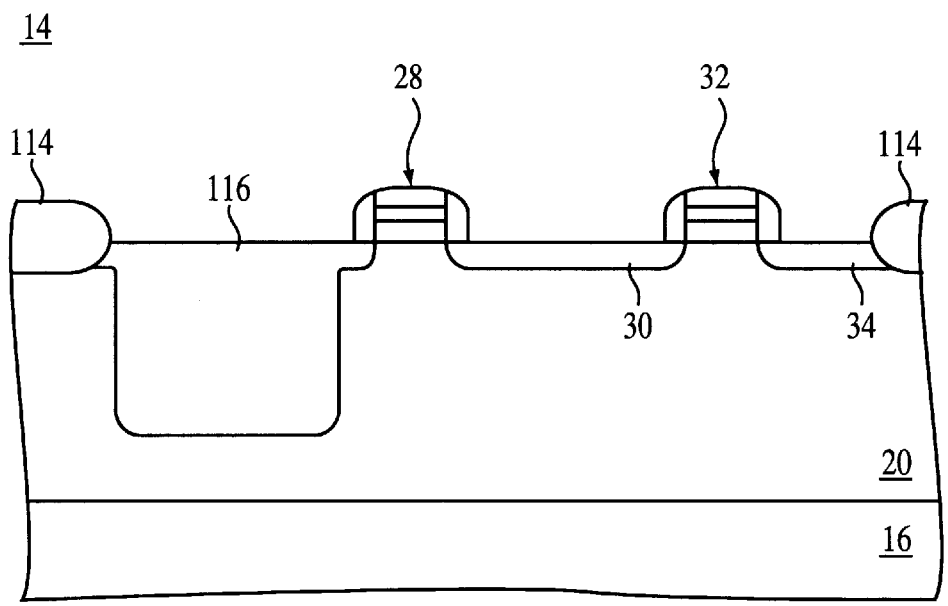
FIG. 12 shows the wafer of FIG. 6 undergoing an alternative process according to an embodiment of the present invention.
Figure 13:
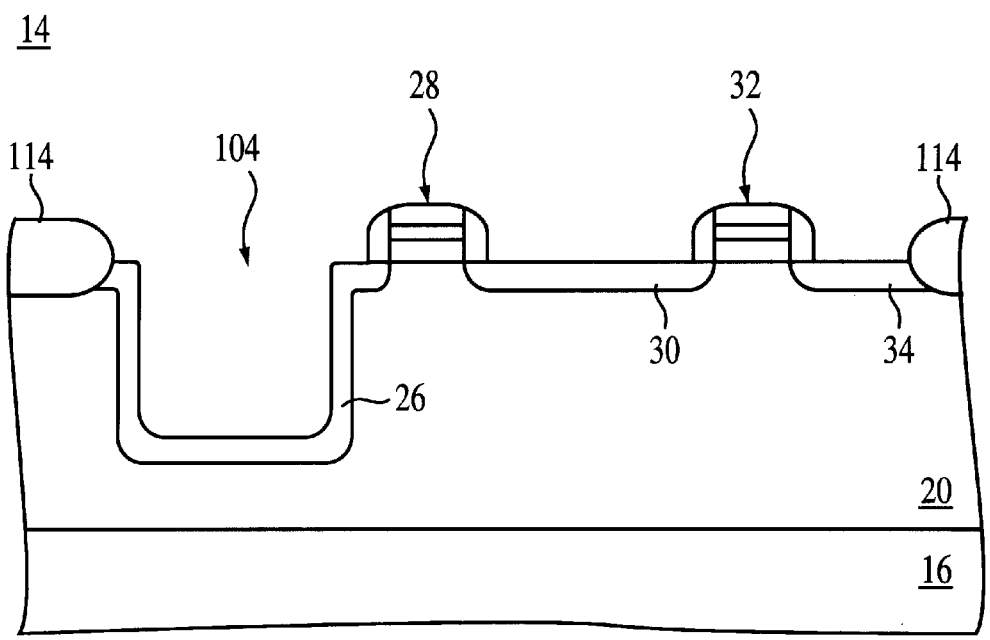
FIG. 13 shows the wafer of FIG. 12 at a processing step subsequent to that shown in FIG. 12.

An alternative embodiment of the process is illustrated by FIG. 6 and FIGS. 12 and 13. As shown in FIG. 6, this process also begins with a substrate 16 having a doped layer or well 20 of a first conductivity type, e.g., p-type, on which the transfer gate 28 and the reset transistor gate 32 have been formed. Referring now to FIG. 12, the next step in the alternative process is to form doped regions and a deep doped well 116 in the doped layer 20. A resist and mask (not shown) are used to expose only the areas to be doped, and a suitable doping process, such as ion implantation, is used to form a deep well 116 of a second conductivity type, e.g., n-type, in the doped layer 20. The doped regions 30, 34 may also be formed at this time by ion implantation or other suitable means.

As shown in FIG. 13, the next step is to form a trench in the well 116. A resist and mask (not shown) are applied, and photolithographic techniques are used to define the area to be etched-out. A directional etching process such as Reactive Ion Etching (RIE), or etching with a preferential anisotropic etchant is used to etch into the well 116 to a sufficient depth, e.g., about 0.05 to 10 $\mu$m to form a trench 104. The depth of the trench should be sufficient to form the photosensor 24 of the present invention therein. The resist and mask are removed, leaving a structure that appears as shown in FIG. 13. The photosensor 24 is then further formed according to the process described above in conjunction with reference to FIGS. 10 and 11. Pixel arrays having the photosensors of the present invention, and described with reference to FIGS. 5–13, may be further processed as known in the art to arrive at CMOS imagers having the functions and features of those discussed with reference to FIGS. 1–4.

Figure 14:
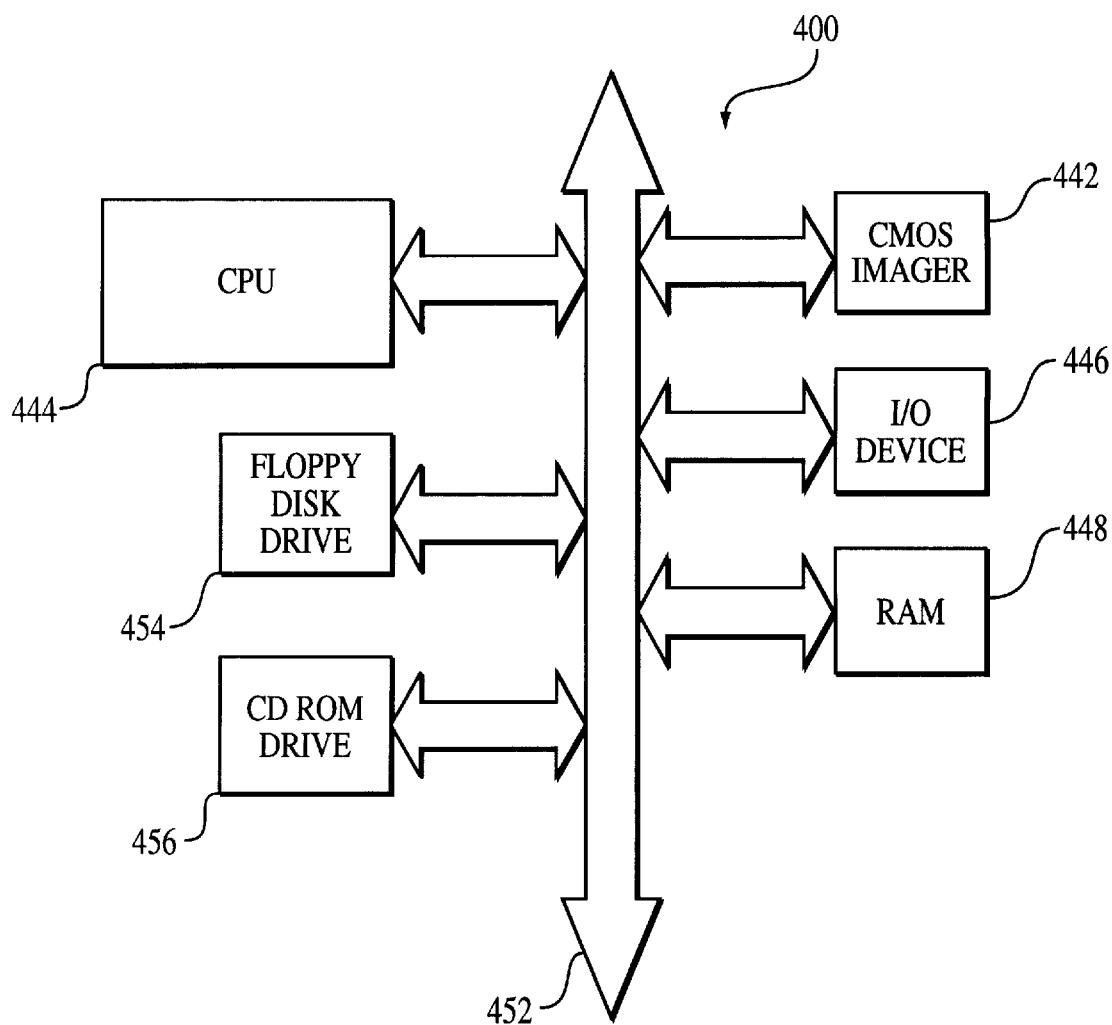
FIG. 14 is an illustration of a computer system having a CMOS imager according to the present invention.

A typical processor based system which includes a CMOS imager device according to the present invention is illustrated generally at 400 in FIG. 14. A processor based system is exemplary of a system having digital circuits which could include CMOS imager devices. Without being limiting, such a system could include a computer system, camera system, scanner, machine vision system, vehicle navigation system, video telephone, surveillance system, auto focus system, star tracker system, motion detection system, image stabilization system and data compression system for high-definition television, all of which can utilize the present invention.

A processor system, such as a computer system, for example generally comprises a central processing unit (CPU) 444, e.g., a microprocessor, that communicates with an input/output (I/O) device 446 over a bus 452. The CMOS imager 442 also communicates with the system over bus 452. The computer system 400 also includes random access memory (RAM) 448, and, in the case of a computer system may include peripheral devices such as a floppy disk drive 454 and a compact disk (CD) ROM drive 456 which also communicate with CPU 444 over the bus 452. CMOS imager 442 is preferably constructed as an integrated circuit which includes pixels containing a photosensor such as a photogate or photodiode formed in a trench, as previously described with respect to FIGS. 5 through 13. The CMOS imager 442 may be combined with a processor, such as a CPU, digital signal processor or microprocessor, with or without memory storage, in a single integrated circuit, or maybe on a different chip than the processor.

As can be seen by the embodiments described herein, the present invention encompasses a photosensor such as a photogate or photodiode formed in a trench. The trench photosensor has an improved charge capacity due to the increase in surface area of the trench photosensor compared to conventional flat photosensors. In addition, the trench photosensor occupies a smaller area than a flat photosensor, thus allowing the size of the pixel cell to be decreased.

It should again be noted that although the invention has been described with specific reference to CMOS imaging circuits having a photogate and a floating diffusion region, the invention has broader applicability and may be used in any CMOS imaging apparatus. Similarly, the process described above is but one method of many that could be used. The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A photosensor for use in an imaging device, said photosensor comprising:
   a doped layer of a first conductivity type formed in a substrate;
   a trench formed in said doped layer;
   a doped region of a second conductivity type formed at the sidewalls and bottom of said trench; and
   an insulating layer formed over said doped region.

2. The photosensor of claim 1, wherein the photosensor is a photodiode sensor.

3. The photosensor of claim 2, wherein the insulating layer has a thickness of at least 30 Angstroms.

4. The photosensor of claim 1, wherein the trench has a depth within the range of approximately 0.05 to 10 $\mu$m.

5. The photosensor of claim 1, further comprising a conductive layer formed on substantially all of an upper surface of said insulating layer for gating the collection of charges in said doped region.

6. The photosensor of claim 5, wherein the insulating layer has a thickness within the range of approximately 20 to 500 Angstroms.

7. The photosensor of claim 5, wherein the photosensor is a photogate sensor.

8. The photosensor of claim 5, wherein the conductive layer is a doped polysilicon layer.

9. The photosensor of claim 5, wherein the conductive layer is a layer of indium tin oxide.

10. The photosensor of claim 5, wherein the conductive layer is a layer of tin oxide.

11. The photosensor of claim 5, wherein the conductive layer is a doped layer of a second conductivity type.

12. The photosensor of claim 5, wherein the conductive layer is substantially transparent to light radiation.

13. The photosensor of claim 5, wherein the conductive layer has a thickness within the range of approximately 200 to 4000 Angstroms.

14. The photosensor of claim 1, wherein the insulating layer is a silicon dioxide layer.

15. The photosensor of claim 1, wherein the insulating layer is a silicon nitride layer.

16. The photosensor of claim 1, wherein the insulating layer is a layer of ONO.

17. The photosensor of claim 1, wherein the insulating layer is a layer of ON.

18. The photosensor of claim 1, wherein the insulating layer is a layer of NO.

19. The photosensor of claim 1, wherein the first conductivity type is p-type, and the second conductivity type is n-type.

20. The photosensor of claim 1, wherein the doped region is formed by a process of multiple angled ion implantation.

21. The photosensor of claim 20, wherein the process comprises four orthogonal angled implants at a dose of $1 \times 10^{12}$ to $1 \times 10^{16}$ ions/cm$^2$, wherein a resist is placed on top of the substrate while implanting, and wherein the angle of implantation for each angled implant is greater than $\theta_C$, where $\tan \theta_C = [(t+d)/(w)]$, where t is the thickness of the resist, d is the depth of the trench, and w is the width of the trench.

22. The photosensor of claim 21, wherein the dose of each implant is $1 \times 10^{13}$ to $1 \times 10^{15}$ ions/cm$^2$.

23. The photosensor of claim 21, wherein the dose of each implant is $5 \times 10^{13}$ ions/cm$^2$.

24. A photogate sensor for use in an imaging device, said photogate sensor comprising:
- a doped layer of a first conductivity type formed in a substrate;
- a trench formed in said doped layer;
- a doped region of a second conductivity type formed at the sidewalls and bottom of said trench;
- an insulating layer formed on substantially all of an upper surface of said doped region; and
- a light radiation-transparent electrode formed on substantially all of an upper surface of said insulating layer for gating the collection of charges in said doped region.

25. The photogate sensor of claim 24, wherein the trench has a depth within the range of approximately 0.05 to 10 µm.

26. The photogate sensor of claim 24, wherein the first conductivity type is p-type, and the second conductivity type is n-type.

27. The photogate sensor of claim 24, wherein the insulating layer has a thickness within the range of approximately 20 to 500 Angstroms.

28. The photogate sensor of claim 24, wherein the insulating layer is a layer of silicon dioxide.

29. The photogate sensor of claim 24, wherein the insulating layer is a layer of silicon nitride.

30. The photogate sensor of claim 24, wherein the insulating layer is a layer of ONO.

31. The photogate sensor of claim 24, wherein the insulating layer is a layer of ON.

32. The photogate sensor of claim 24, wherein the insulating layer is a layer of NO.

33. The photogate sensor of claim 24, wherein the radiation-transparent electrode has a thickness within the range of approximately 200 to 4000 Angstroms thick.

34. The photogate sensor of claim 24, wherein the radiation-transparent electrode is a layer of doped polysilicon.

35. The photogate sensor of claim 24, wherein the radiation-transparent electrode is a layer of indium tin oxide.

36. The photogate sensor of claim 24, wherein the radiation-transparent electrode is a layer of tin oxide.

37. The photogate sensor of claim 24, wherein the radiation-transparent electrode is doped to a second conductivity type.

38. The photogate sensor of claim 37, wherein the first conductivity type is p-type, and the second conductivity type is n-type.

39. The photogate sensor of claim 24, wherein the doped region is formed by a process of multiple angled ion implantation.

40. The photogate sensor of claim 39, wherein the process comprises four orthogonal angled implants at a dose of $1 \times 10^{12}$ to $1 \times 10^{16}$ ions/cm$^2$, wherein a resist is placed on top of the substrate while implanting, and wherein the angle of implantation for each angled implant is greater than $\theta_C$, where $\tan \theta_C = [(t+d)/(½ \, w)]$, where t is the thickness of the resist, d is the depth of the trench, and w is the width of the trench.

41. The photogate sensor of claim 40, wherein the dose of each implant is $1 \times 10^{13}$ to $1 \times 10^{15}$ ions/cm$^2$.

42. The photogate sensor of claim 40, wherein the dose of each implant is $5 \times 10^{13}$ ions/cm$^2$.

43. A photodiode sensor for use in an imaging device, said photodiode sensor comprising:
- a doped layer of a first conductivity type formed in a substrate;
- a trench formed in said doped layer, wherein the trench has a depth within the range of approximately 0.05 to 10 µm; and
- a doped region of a second conductivity type formed at the sidewalls and bottom of said trench.

44. The photodiode sensor of claim 43, wherein the first conductivity type is p-type and the second conductivity type is n-type.

45. The photodiode sensor of claim 43, wherein the doped region is formed by a process of multiple angled ion implantation.

46. The photodiode sensor of claim 45, wherein the process comprises four orthogonal angled implants at a dose of $1 \times 10^{12}$ to $1 \times 10^{16}$ ions/cm$^2$, wherein a resist is placed on top of the substrate while implanting, and wherein the angle of implantation for each angled implant is greater than $\theta_C$, where $\tan \theta_C = [(t+d)/(w)]$, where t is the thickness of the resist, d is the depth of the trench, and w is the width of the trench.

47. The photodiode sensor of claim 46, wherein the dose of each implant is $1 \times 10^{13}$ to $1 \times 10^{15}$ ions/cm$^2$.

48. The photodiode sensor of claim 46, wherein the dose of each implant is $5 \times 10^{13}$ ions/cm$^2$.

49. A pixel sensor cell for use in an imaging device, said pixel sensor cell comprising:
- a doped layer of a first conductivity type formed in a substrate;
- a trench formed in said doped layer;
- a first doped region of a second conductivity type formed at the sidewalls and bottom of said trench;
- an insulating layer formed over said first doped region;
- a second doped region of a second conductivity type formed in said doped layer and positioned to receive charges from said first doped region of said trench; and
- a reset transistor formed at the doped layer for periodically resetting a charge level of said second doped region, said second doped region being the source of said reset transistor.

50. The pixel sensor cell of claim 49, wherein the pixel sensor cell is a photodiode sensor cell.

51. The pixel sensor cell of claim 50, wherein the insulating layer has a thickness of at least 30 Angstroms.

52. The pixel sensor cell of claim 49, further comprising a conductive layer formed on substantially all of an upper surface of said insulating layer for gating the collection of charges in said first doped region.

53. The pixel sensor cell of claim 52, wherein the insulating layer has a thickness within the range of approximately 20 to 500 Angstroms.

54. The pixel sensor cell of claim 52, wherein said conductive layer is a layer of indium tin oxide.

55. The pixel sensor cell of claim 52, wherein said conductive layer is a layer of tin oxide.

56. The pixel sensor cell of claim 52, wherein said conductive layer is a layer of doped polysilicon.

57. The pixel sensor cell of claim 52, wherein the pixel sensor cell is a photogate sensor cell.

58. The pixel sensor cell of claim 52, further comprising a transfer gate formed on the doped layer between the trench and the second doped region.

59. The pixel sensor cell of claim 58, wherein said conductive layer extends over a top surface of the transfer gate.

60. The pixel sensor cell of claim 58, wherein said insulating layer extends over the top surface of the transfer gate.

61. The pixel sensor cell of claim 52, wherein said conductive layer is substantially transparent to radiation.

62. The pixel sensor cell of claim 52, wherein said conductive layer is a layer of doped polysilicon.

63. The pixel sensor cell of claim 49, wherein said insulating layer is a layer of silicon dioxide.

64. The pixel sensor cell of claim 49, wherein the first conductivity type is p-type, and the second conductivity type is n-type.

65. The pixel sensor cell of claim 49, wherein the first doped region is formed by a process of multiple angled ion implantation.

66. The pixel sensor cell of claim 65, wherein the process comprises four orthogonal angled implants at a dose of $1 \times 10^{12}$ to $1 \times 10^{16}$ ions/cm$^2$, wherein a resist is placed on top of the substrate while implanting, and wherein the angle of implantation for each angled implant is greater than $\theta_C$, where $\tan \theta_C = [(t+d)/(w)]$, where t is the thickness of the resist, d is the depth of the trench, and w is the width of the trench.

67. The pixel sensor cell of claim 66, wherein the dose of each implant is $1 \times 10^{13}$ to $1 \times 10^{15}$ ions/cm$^2$.

68. The pixel sensor cell of claim 66, wherein the dose of each implant is $5 \times 10^{13}$ ions/cm$^2$.

69. A pixel sensor cell for use in an imaging device, said pixel sensor cell comprising:
   a doped layer of a first conductivity type formed in a substrate;
   a trench formed in said doped layer;
   a photodiode formed in said trench, wherein said photodiode comprises a first doped region of a second conductivity type formed at the sidewalls and bottom of said trench, and an insulating layer formed on an upper surface of said first doped region;
   a second doped region of a second conductivity type formed in said doped layer and positioned to receive charges from said first doped region of said trench; and
   a reset transistor formed at the doped layer for periodically resetting a charge level of said second doped region, said second doped region being the source of said reset transistor.

70. A pixel sensor cell for use in an imaging device, said pixel sensor cell comprising:
   a doped layer of a first conductivity type formed in a substrate;
   a trench formed in said doped layer;
   a photogate formed in said trench, wherein said photogate comprises a first doped region of a second conductivity type formed at the sidewalls and bottom of said trench, a conductive layer formed on substantially all of an upper surface of said first doped region for gating the collection of charges in said first doped region, and an insulating layer formed between said first doped region and said conductive layer;
   a second doped region of a second conductivity type formed in said doped layer and positioned to receive charges from said first doped region of said trench; and
   a reset transistor formed at the doped layer for periodically resetting a charge level of said second doped region, said second doped region being the source of said reset transistor.

71. A pixel sensor cell for use in an imaging device, said pixel sensor cell comprising:
   a trench photosensor formed in a doped layer of a first conductivity type of a substrate;
   a reset transistor formed in said doped layer;
   a floating diffusion region of a second conductivity type formed in said doped layer between the trench photosensor and the reset transistor for receiving charges from said trench photosensor, said reset transistor operating to periodically reset a charge level of said floating diffusion region; and
   an output transistor having a gate electrically connected to the floating diffusion region.

72. The pixel sensor cell of claim 71, wherein the trench photosensor further comprises a doped region of a second conductivity type located on the sidewalls and bottom of said trench.

73. The pixel sensor cell of claim 71, wherein the trench photosensor is a photodiode sensor.

74. The pixel sensor cell of claim 71, further comprising a transfer gate located between the trench photosensor and the floating diffusion region.

75. The pixel sensor cell of claim 74, wherein the trench photosensor is a photogate sensor.

76. The pixel sensor cell of claim 71, wherein the first conductivity type is p-type, and the second conductivity type is n-type.

77. A CMOS imager comprising:
   a substrate having a doped layer of a first conductivity type;
   an array of pixel sensor cells formed in said doped layer, wherein each pixel sensor cell has a trench photosensor; and
   signal processing circuitry electrically connected to receive and process output signals from said array.

78. The CMOS imager of claim 77, wherein the trench photosensor further comprises a doped region of a second conductivity type located on the sidewalls and bottom of said trench.

79. The CMOS imager of claim 78, wherein the second conductivity type is n-type.

80. The CMOS imager of claim 77, wherein the trench photosensors are photodiode sensors.

81. The CMOS imager of claim 77, wherein the trench photosensors are photogate sensors.

82. The CMOS imager of claim 77, wherein the first conductivity type is p-type.

83. An integrated circuit imager comprising:

an array of pixel sensor cells formed in a substrate, wherein each pixel sensor cell has a trench photosensor;

signal processing circuitry formed in said substrate and electrically connected to the array for receiving and processing signals representing an image output by the array and for providing output data representing said image; and a processor for receiving and processing data representing said image.

84. An integrated circuit imager comprising:

a CMOS imager, said CMOS imager comprising an array of pixel sensor cells formed in a doped layer on a substrate, wherein each pixel sensor cell has a trench photosensor with a first doped region formed therein, each of said cells having a respective second doped region for receiving and outputting image charge received from said first doped region, and signal processing circuitry formed in said substrate and electrically connected to the array for receiving and processing signals representing an image output by the array and for providing output data representing said image; and a processor for receiving and processing data representing said image.

* * * * *

UNITED STATES PATENT AND TRADEMARK OFFICE
CERTIFICATE OF CORRECTION

PATENT NO. : 6,232,626 B1
DATED : May 15, 2001
INVENTOR(S) : Howard E. Rhodes

Page 1 of 1

It is certified that error appears in the above-identified patent and that said Letters Patent is hereby corrected as shown below:

Title page,
OTHER PUBLICATIONS, change "Zhou, Z., et al.,"A CMOS Imager with On-Chip Variable Resolution for Light-Adaptive Imaging" 1998 IEEE International Solid-State Circuits Conference, pp. 174-174" to -- Zhou, Z., et al., "A CMOS Imager with On-Chip Variable Resolution for Light-Adaptive Imaging" 1998 IEEE International Solid-State Circuits Conference, pp. 174-175 --.

Column 4,
Line 61, change "to" to -- $t_0$ --.

Signed and Sealed this

Twelfth Day of March, 2002

Attest:

Attesting Officer

JAMES E. ROGAN
Director of the United States Patent and Trademark Office